United States Patent
Tolk et al.

(10) Patent No.: US 6,856,159 B1
(45) Date of Patent: Feb. 15, 2005

(54) CONTACTLESS OPTICAL PROBE FOR USE IN SEMICONDUCTOR PROCESSING METROLOGY

(75) Inventors: Norman H. Tolk, Brentwood, TN (US); Gunter Leupke, Williamsburg, VA (US); Wei Wang, Austin, TX (US)

(73) Assignee: Vanderbilt University, Nashville, TN (US)

( * ) Notice: Subject to any disclaimer, the term of this patent is extended or adjusted under 35 U.S.C. 154(b) by 0 days.

(21) Appl. No.: 10/363,347

(22) PCT Filed: Mar. 15, 2000

(86) PCT No.: PCT/US00/06879

§ 371 (c)(1),
(2), (4) Date: Sep. 15, 2003

(87) PCT Pub. No.: WO00/55885

PCT Pub. Date: Sep. 21, 2000

Related U.S. Application Data

(60) Provisional application No. 60/125,002, filed on Mar. 18, 1999.

(51) Int. Cl.[7] .............................................. G01R 31/02
(52) U.S. Cl. ........................................ 324/765; 324/752
(58) Field of Search ................................. 324/765, 752, 324/751, 750, 767; 437/8; 257/48

(56) References Cited

U.S. PATENT DOCUMENTS

| | | | |
|---|---|---|---|
| 4,758,092 A | 7/1988 | Heinrich et al. | 356/364 |
| 5,283,141 A | 2/1994 | Yoon et al. | 430/30 |
| 5,416,337 A | 5/1995 | Chang et al. | 257/13 |
| 5,500,188 A | 3/1996 | Hafeman et al. | 422/82.02 |
| 5,519,334 A | * 5/1996 | Dawson | 324/765 |
| 5,559,428 A | 9/1996 | Li et al. | 324/71.5 |
| 5,705,831 A | 1/1998 | Uemura et al. | 257/78 |
| 5,750,981 A | 5/1998 | Fonash | 250/214 |
| 5,770,946 A | 6/1998 | Patterson | 324/752 |
| 5,867,034 A | 2/1999 | Sokolov et al. | 324/765 |
| 5,872,360 A | 2/1999 | Paniccia et al. | 250/341.4 |

OTHER PUBLICATIONS

Wang, W., et al, "Wavelength Selective Alteration of the Si(001)/SiO$_2$ Interface by Intense Tunable Infrared Radiation" APS Mtg. Mar. 18, 1998 in L.A published on Web.

Wang, W., et al, "Coupled Electron–Hole Dynamics at the Si/SiO$_2$ Interface" Physical Review Letters, vol. 81, No. 19, Nov. 9, 1998.

International Search Report PCT/US00/06879 dated May 16, 2000.

* cited by examiner

*Primary Examiner*—Kiet T Nguyen
(74) *Attorney, Agent, or Firm*—Morris, Manning & Martin; Tim Tingkang Xia, Esq.

(57) ABSTRACT

A method and/or device (285) for determining first and second band offsets (100, 110) at a semiconductor/dielectric heterointerface (115), which includes the semiconductor/dielectric heterointerface (115) exposed to incident photons (205) from a light source (200); a detector (275, 280) for generating a signal by detecting emitted photons (260, 265) from the semiconductor/dielectric heterointerface (115); and an element (310) for changing the energy of incident photons (205) to monitor the first and second band offsets (100, 110).

81 Claims, 8 Drawing Sheets

CONTACTLESS OPTICAL PROBE FOR USE IN SEMICONDUCTOR PROCESSING METROLOGY

The present application claims priority to provisional application Ser. No. 60/125,002, filed Mar. 18, 1999, the entire text and figures of which is incorporated herein by reference without disclaimer.

The present invention was made with United States government support under Grants No. N00014-94-1-1023, N00014-94-1-0995, and N00014-96-1-1286 awarded by the Office of Naval Research. The United States government has certain rights in the present invention.

BACKGROUND OF THE INVENTION

1. Field of the Invention

This invention relates generally to semiconductor processing technology, and, more particularly, to a device and method for contactless metrology.

2. Description of the Related Art

The physical characteristics, and, in particular, the electronic characteristics of the silicon/silicon dioxide ($Si/SiO_2$) interface have played a major role in establishing the dominance of Si in semiconductor technology. As the physical dimensions and critical dimensions (CD) of semiconductor devices such as Complementary Metal Oxide Semiconductor (CMOS) transistors, and the like, continue to shrink, it is becoming increasingly important to understand how thin oxide films influence the charge carrier dynamics at buried $Si/SiO_2$ interfaces. Examples of such influences include charge breakdown and hot carrier injection.

Valence band-offset ($\Delta_{vb}$) may be defined as the difference between the top of the valence band 100 in Si and the top of the valence band 105 in $SiO_2$ (see FIG. 1). Similarly, conduction band-offset ($\Delta_{cb}$) may be defined as the difference between the bottom of the conduction band 110 in Si and the bottom of the conduction band 115 in $SiO_2$ (see FIG. 1). The band-offsets $\Delta_{vb}$ and $\Delta_{cb}$ at the $Si/SiO_2$ interface are important parameters that help determine whether thin oxide films will exert influences such as charge breakdown and hot carrier injection over the charge carrier dynamics. The band-offsets $\Delta_{vb}$ and $\Delta_{cb}$ at the $Si/SiO_2$ interface represent barrier heights for carrier injection or quantum mechanical tunneling processes, for example. Bandgap $\Delta_{bg}$ in Si is about 1.1 eV and bandgap $\Delta_{bg}$ in $SiO_2$ is about 9 eV (see FIG. 1).

Several techniques have traditionally been used to measure one or more of the band-offsets $\Delta_{vb}$ and $\Delta_{cb}$ at semiconductor heterointerfaces (interfaces between different types of materials) such as the $Si/SiO_2$ heterointerface. For example, X-ray photoelectron spectroscopy (XPS) has been employed for measuring valence band-offsets ($\Delta_{vb}$). Although this technique allows contactless $\Delta_{vb}$ measurements, it utilizes X-ray photons of several tens of eVs and is therefore limited in energy resolution to a few hundred meV (a few percent of the X-ray photon energy). Internal photoemission spectroscopy, which can be used for measuring both, the $\Delta_{vb}$ and conduction band-offsets ($\Delta_{cb}$), on the other hand, requires electrical contacts on the device under test to measure the photo-generated current in an external circuit. This becomes increasingly difficult, as gate oxide thicknesses shrink below 40 Å. In addition, for using internal photoemission, the semiconductor has to be doped p-type or n-type to measure $\Delta_{vb}$ or $\Delta_{cb}$, respectively.

The present invention is directed to overcoming, or at least reducing the effects of, one or more of the problems set forth above.

SUMMARY OF THE INVENTION

In one aspect of the present invention, a method is provided for determining first and second band-offsets at a semiconductor/dielectric heterointerface, the method comprising exposing the semiconductor/dielectric heterointerface to incident photons and generating a signal by detecting emitted photons that have interacted with the semiconductor/dielectric heterointerface. The method also comprises changing the energy of the incident photons and monitoring the signal to determine a first threshold energy for injection of first carriers into the dielectric of the semiconductor/dielectric heterointerface, the first threshold energy corresponding to the first band-offset. The method further comprises changing the energy of the incident photons beyond the first threshold energy and monitoring the signal to determine a second threshold energy for injection of second carriers into the dielectric of the semiconductor/dielectric heterointerface, the second threshold energy corresponding to the second band-offset.

In another aspect of the present invention, a device is provided to determine first and second band-offsets at a semiconductor/dielectric heterointerface, the device comprising a source of incident photons exposing the semiconductor/dielectric heterointerface to the incident photons and a detector generating a signal by detecting, emitted photons that have interacted with the semiconductor/dielectric heterointerface. The device also comprises having the energy of the incident photons be changeable and the signal be monitorable to determine a first threshold energy for injection of first carriers into the dielectric of the semiconductor/dielectric heterointerface, the first threshold energy corresponding to the first band-offset. The method further comprises having the energy of the incident photons be changeable beyond the first threshold energy and the signal be monitorable to determine a second threshold energy for injection of second carriers into the dielectric of the semiconductor/dielectric heterointerface, the second threshold energy corresponding to the second band-offset.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

DETAILED DESCRIPTION OF SPECIFIC EMBODIMENTS

Figure 1:
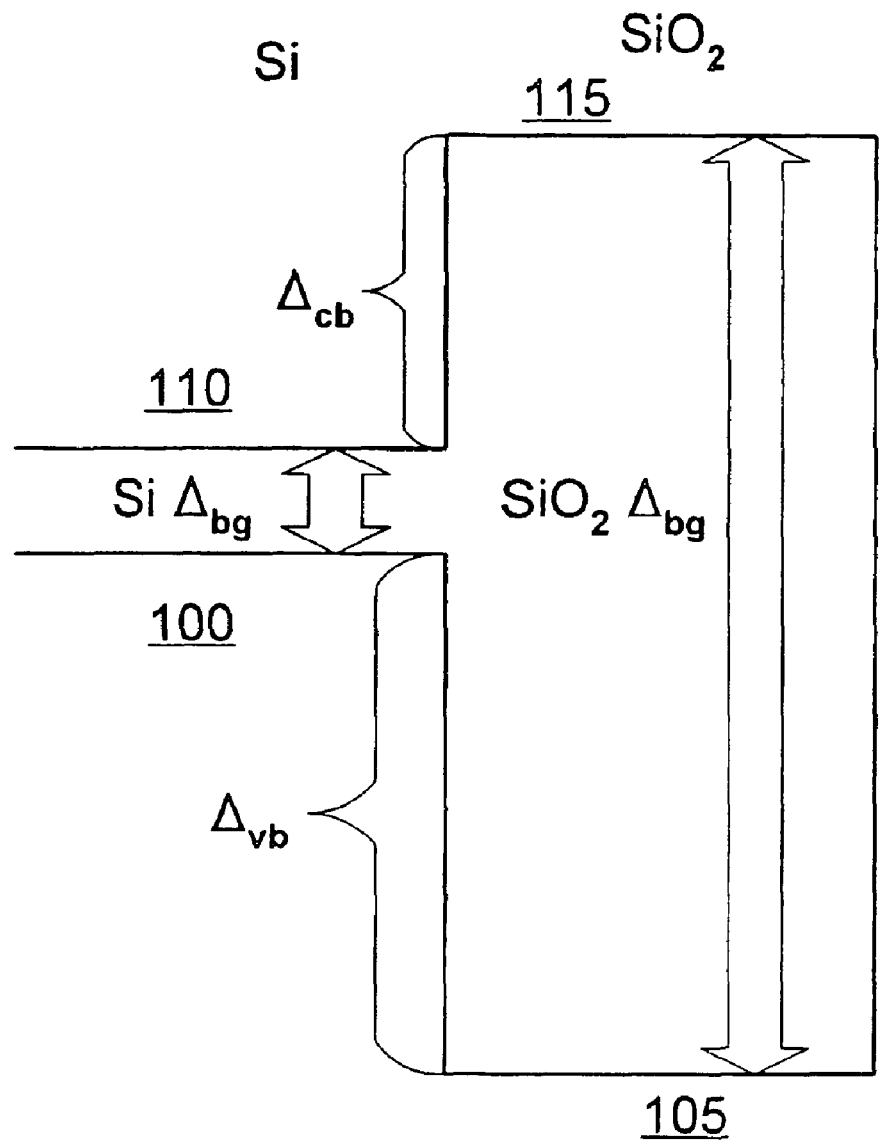
FIG. 1 illustrates schematically band-offsets and band-gaps at a heterointerface.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention permits band-offset measurements at semiconductor/dielectric, semiconductor/semiconductor, metal/semiconductor, and metal/dielectric heterointerfaces. As will be understood, any metal, dielectric and semiconductor, amorphous, monocrystalline or polycrystalline, possessing a cubic structure with the [100] direction (x axis) normal to the heterointerface is suitable for practice of the invention. For purposes of description and illustration, band-offset measurements at an $Si/SiO_2$ heterointerface will be described, having particular applications in the testing of MOSFET transistors used in microelectronics. Applicants' present invention, however, is not so limited, and may find applications in a variety of heterointerfaces within a variety of semiconductor devices. For example, the present invention may find applications to band-offset measurements at a plurality of heterointerfaces, as in quantum wells and/or quantum well superlattices. The present invention may also find applications to band-offset measurements at heterointerfaces between two different semiconductors having different bandgaps and/or between a metal and a semiconductor and/or between a metal and a dielectric, for example.

Illustrative embodiments of a new optical technique in accordance with the present invention allow precise measurements (with energy resolutions of approximately 10 meV) of band-offsets at semiconductor/dielectric heterointerfaces. An optical signal is generated by a laser beam, either in reflection or in transmission from the structure under test (see FIGS. 2 and 3). The optical signal is sensitive to the space charge field E(t) in the semiconductor at the buried heterointerface. In addition, in alternative illustrative embodiments of the present invention, the optical signal may be sensitive to external electric and/or external magnetic fields in the semiconductor at the buried heterointerface. In other alternative illustrative embodiments of the present invention, we also believe that the optical signal may be sensitive to piezoelectric stress and/or piezoelectric strain fields in the semiconductor at the buried heterointerface. Depending on the crystal structure of the semiconductor substrate, two different optical effects may be employed to monitor the space charge field E(t): (1) second-order nonlinear optical effects and (2) the Pockels effect.

For centrosymmetric semiconductors, such as Ge and Si, the Pockels-effect vanishes because of the centrosymmetric crystal structure. In this case, a higher-order nonlinear optical effect is utilized for monitoring the space charge field E(t). A quasi-static electric field breaks the inversion symmetry of a centrosymmetric medium, which allows a bulk dipolar second-harmonic response. This method will be called electric field-induced second-harmonic generation (EFISHG). The electric field-induced second-harmonic generation (EFISHG) technique can therefore be used for monitoring a space charge field E(t) at the surface and/or interface and/or heterointerface of centrosymmetric semiconductors.

Figure 2:
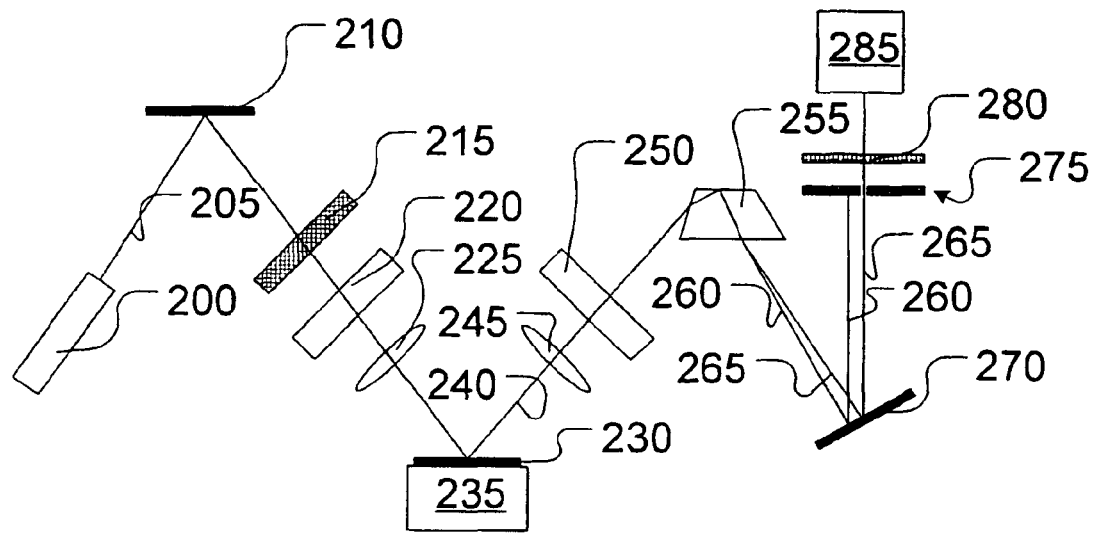
FIG. 2 illustrates schematically various embodiments of a method according to the present invention.

As shown in FIG. 2, a source 200 of substantially monochromatic electromagnetic radiation may produce a stream of incident photons 205. The incident photons 205 may be reflected from a mirror 210 and may pass through a filter 215, a first polarizer 220 and a lens or lens system 225. The incident photons 205 interact with the space charge field E(t) of the $Si/SiO_2$ heterointerface sample 230 on sample stand 235. Emitted photons 240 that have interacted with the space charge field E(t) of the $Si/SiO_2$ heterointerface may pass through a lens or lens system 245 and a second polarizer 250 and enter a prism 255. The emitted photons 240 may be separated by the prism 255 into photons 260 with an energy hω or hv (first-harmonic photons) and photons 265 with an energy 2hω or 2hv (second-harmonic photons). The photons 260 and 265 may be reflected from a mirror 270. The photons 260 are stopped by a discriminator (slit) 275 that selects the second-harmonic photons 265. The second-harmonic photons 265 may pass through a filter 280 and enter a photomultiplier tube/photon counter 285 that counts the second-harmonic photons 265. In alternative embodiments (not shown), the emitted photons 240 that have interacted with the space charge field E(t) of the $Si/SiO_2$ heterointerface may pass transmissively through the sample 230 rather than being reflected thereby.

The Pockels effect may be utilized in non-centrosymmetric semiconductors, for example III-V and II-VI compound semiconductors. In this case, the space charge field E(t) couples to the optical field via the Pockels effect in the semiconductor. For a linear polarized excitation beam, for example, this internal, linear electro-optic effect will generate an elliptically polarized signal, which is directly proportional to the space charge field E(t) at the buried heterointerface. These techniques will be called reflective electro-optical sampling (RE-OS) and transmissive electro-optical sampling (TE-OS), respectively.

Figure 3:
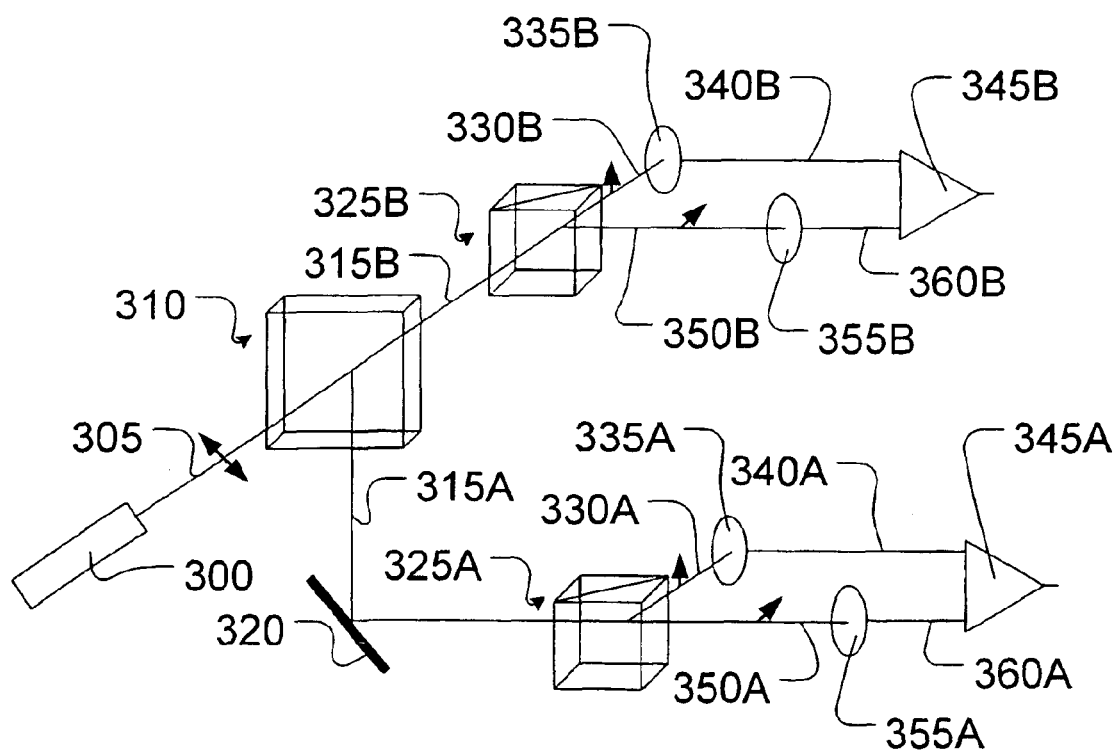
FIG. 3 illustrates schematically various alternative embodiments of a method according to the present invention.

As shown in FIG. 3, a source 300 of substantially monochromatic electromagnetic radiation may produce a stream of linearly-polarized incident photons 305. The incident photons 305 interact with the space charge field E(t) of a $Si/SiO_2$ heterointerface sample 310. For reflective electro-optical sampling (RE-OS), reflectively-emitted photons 315A that have interacted with the space charge field E(t) of the $Si/SiO_2$ heterointerface may be reflected from a mirror 320 and may pass through a beam-splitting polarizer 325A. Beam-split, reflectively-emitted photons 330A having a polarization state substantially perpendicular to the plane of the beam-splitting may be detected by a detector 335A. The detector 335A may send a signal 340A to one input of an amplifier 345A. Beam-split, reflectively-emitted photons 350A having a polarization state substantially in the plane of the beam-splitting may be detected by a detector 355A. The detector 355A may send a signal 360A to the other input of the amplifier 345A.

The signals 340A and 360A correspond to the two components of the elliptical polarization generated by the internal, linear electro-optic Pockels effect on the linearly-polarized incident photons 305. The degree of elliptical polarization of the linearly-polarized excitation beam is directly proportional to the space charge field E(t) at the buried Si/SiO$_2$ heterointerface.

For transmissive electro-optical sampling (TE-OS), transmissively-emitted photons 315B that have interacted with the space charge field E(t) of the Si/SiO$_2$ heterointerface may pass through a beam-splitting polarizer 325B. Beam-split, transmissively-emitted photons 330B having a polarization state substantially perpendicular to the plane of the beam-splitting may be detected by a detector 335B. The detector 335B may send a signal 340B to one input of an amplifier 345B. Beam-split, reflectively-emitted photons 350B having a polarization state substantially in the plane of the beam-splitting may be detected by a detector 355B. The detector 355B may send a signal 360B to the other input of the amplifier 345B.

The signals 340B and 360B also correspond to the two components of the elliptical polarization generated by the internal, linear electro-optic Pockels effect on the linearly-polarized incident photons 305. The degree of elliptical polarization of the linearly-polarized excitation beam is directly proportional to the space charge field E(t) at the buried Si/SiO$_2$ heterointerface.

As described above, a semiconductor/dielectric heterointerface exhibits two band-offsets (see FIG. 1) associated with the conduction bands ($\Delta_{cb}$) and the valence bands ($\Delta_{vb}$). In general, these two band discontinuities, $\Delta_{cb}$ and $\Delta_{vb}$, are different. This enables photo-injection of only one type of carrier, either electrons or holes, by increasing the photon energy $\hbar\omega$ (hv) above the lowest band-offset. In this case, a charge separation will be induced across the buried heterointerface, which will change the space charge field E(t) in the semiconductor at the buried heterointerface. The resulting field-enhancement may be monitored, using a monitor laser beam, and/or a plurality of monitor laser beams, either by electric field-induced second-harmonic generation (EFISHG) techniques or by reflective electro-optical sampling (RE-OS) and/or transmissive electro-optical sampling (TE-OS) techniques.

These optical techniques may be utilized for monitoring the threshold for carrier injection that is determined by the band-offset at the heterointerface. In various illustrative embodiments, ultraviolet light from an ultraviolet lamp, and the like, and/or monochromatic light, for example, from a tungsten or mercury lamp, and the like, and/or one or more tunable and/or pulsed lasers, including free electron lasers, and the like, may be utilized as a pump beam for carrier injection, providing an energy resolution of a few meV for the band-offset. In various alternative illustrative embodiments, one or more tunable and/or pulsed lasers may be used both as a pump beam and as a monitoring beam, as a source for the photons used in the electric field-induced second-harmonic generation (EFISHG) techniques and/or the reflective electro-optical sampling (RE-OS) and/or transmissive electro-optical sampling (TE-OS) techniques.

Figure 4:
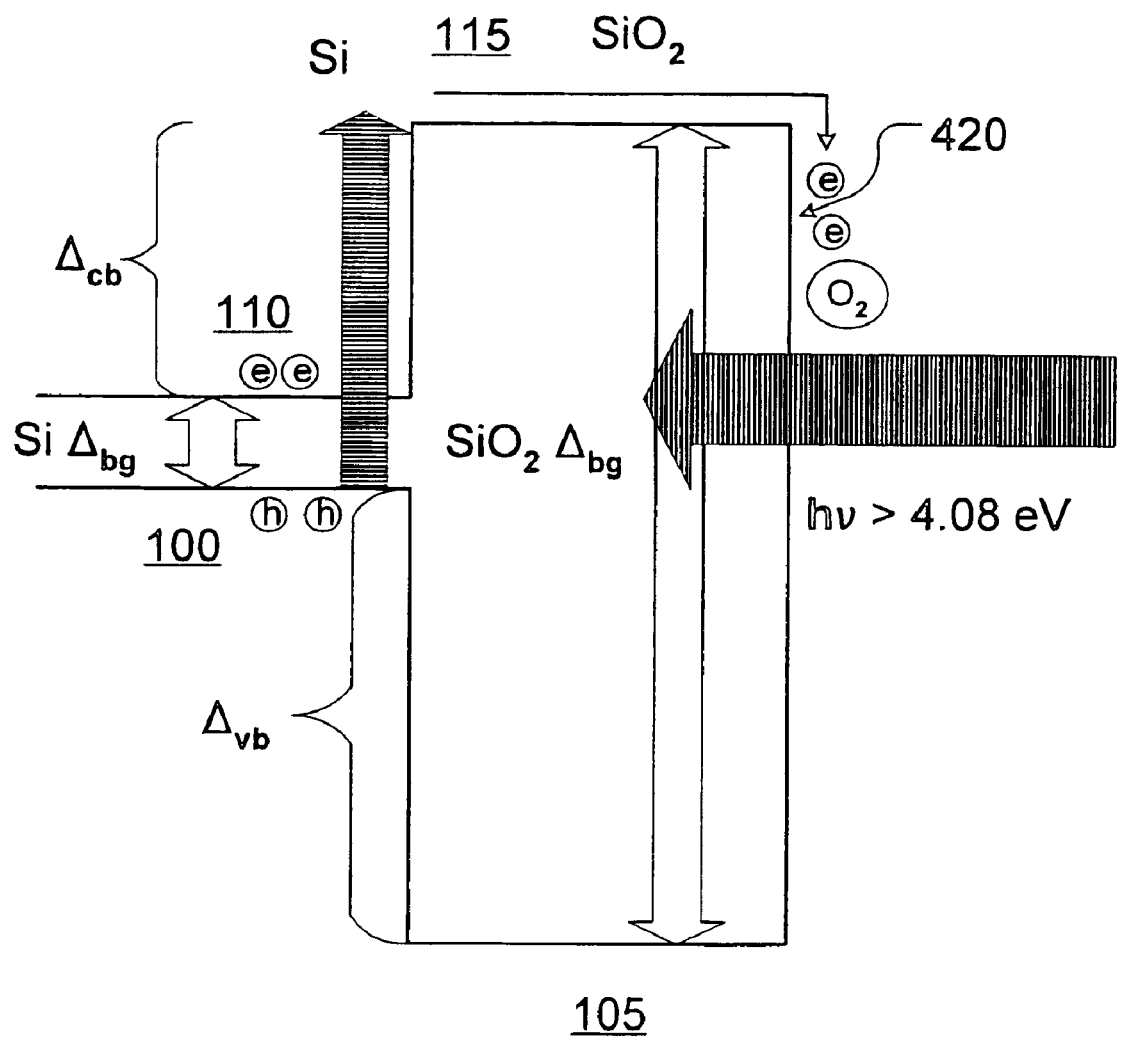
FIG. 4 illustrates schematically ultraviolet photo-injection of electrons at a heterointerface.

For example, in various illustrative embodiments, as shown in FIG. 4, when the energy $\hbar\omega$ (hv) of the incident photons (from an ultraviolet light source, for example) exceeds approximately 4.08 eV (corresponding to an approximate wavelength $\lambda$=3040 Å), electrons (e) from the Si valence band 100 may be excited into the SiO$_2$ conduction band 115. When electrons (e) are excited from the Si valence band 100 into the SiO$_2$ conduction band 115 and become trapped, primarily on an SiO$_2$ outer surface 420 in an oxygen (O$_2$) ambient, a charge separation occurs. This charge separation alters the space charge field E(t) in the Si at the buried Si/SiO$_2$ heterointerface. The resulting alteration in the space charge field E(t) may be monitored, using one or more monitor laser beams, either by electric field-induced second-harmonic generation (EFISHG) techniques (see FIG. 2) or by reflective electro-optical sampling (RE-OS) and/or transmissive electro-optical sampling (TE-OS) techniques (see FIG. 3).

The second band-offset may be determined by increasing the photon energy $\hbar\omega$ (hv) of the pump beam until it passes the threshold for photo-injection of the second type of carriers. The injection of carriers complementary to the ones associated with the lowest band-offset will reduce the charge separation across the heterointerface, and, hence, reduce the space charge field E(t) and the optical signal as well. The photon energy $\hbar\omega$ (hv) at which this process begins corresponds to the second band-offset.

Figure 5:
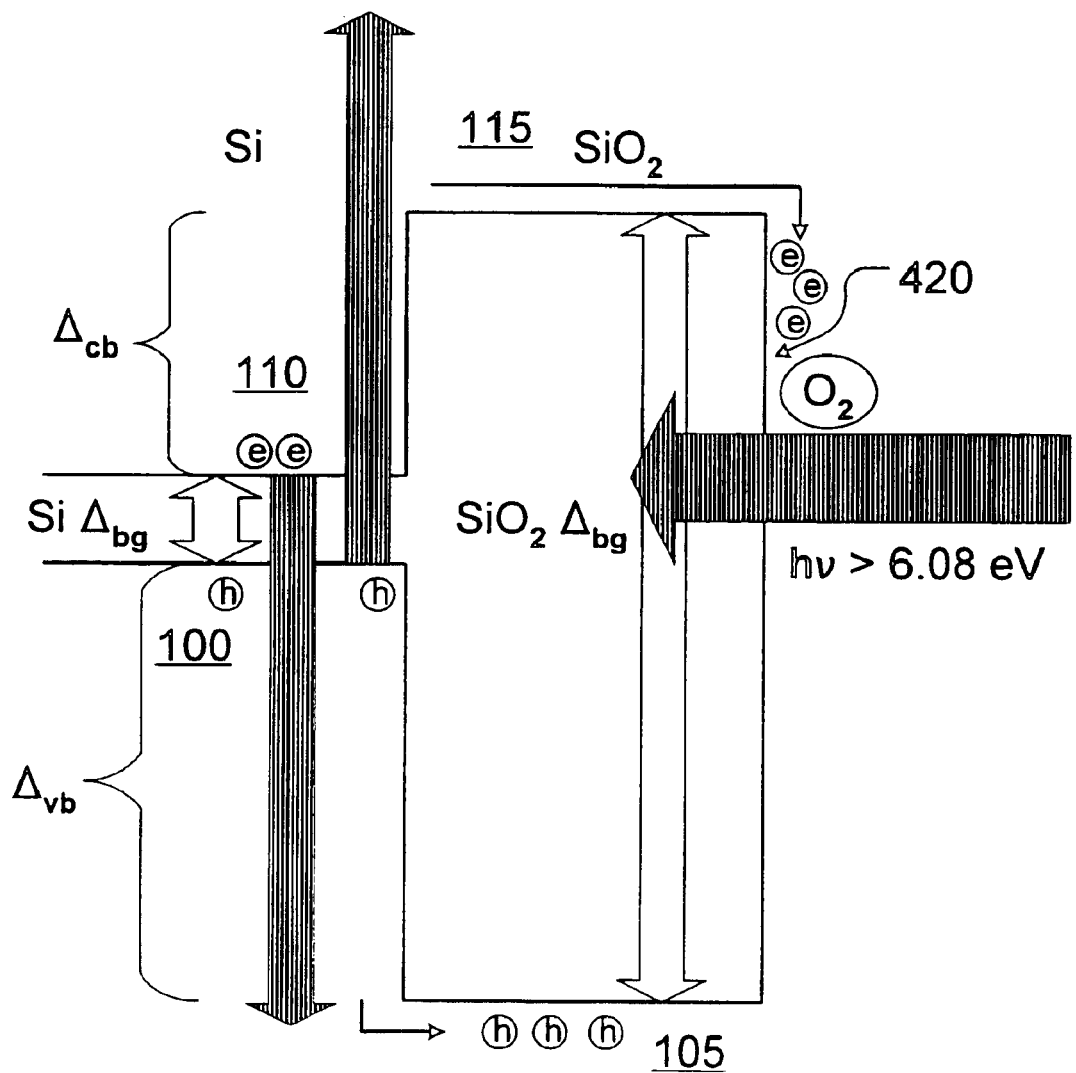
FIG. 5 illustrates schematically ultraviolet photo-injection of electrons and holes at a heterointerface.

For example, in these various illustrative embodiments, as shown in FIG. 5, when the energy $\hbar\omega$ (hv) of the incident photons (from an ultraviolet light source, for example) exceeds approximately 6.08 eV (corresponding to an approximate wavelength $\lambda$=2040 Å), holes (h) may be excited in the SiO$_2$ valence band 105, or, equivalently, holes (h) may be excited from the Si conduction band 110 into the SiO$_2$ valence band 105.

The injection of holes into the SiO$_2$ valence band 105 will reduce the charge separation across the buried Si/SiO$_2$ heterointerface, and, hence, reduce the space charge field E(t) in the Si at the buried Si/SiO$_2$ heterointerface and affect the optical signal as well. The resulting reduction in the space charge field E(t) may be monitored, using one or more monitor laser beams, either by electric field-induced second-harmonic generation (EFISHG) techniques (see FIG. 2) or by reflective electro-optical sampling (RE-OS) and/or transmissive electro-optical sampling (TE-OS) techniques (see FIG. 3).

Figure 6:
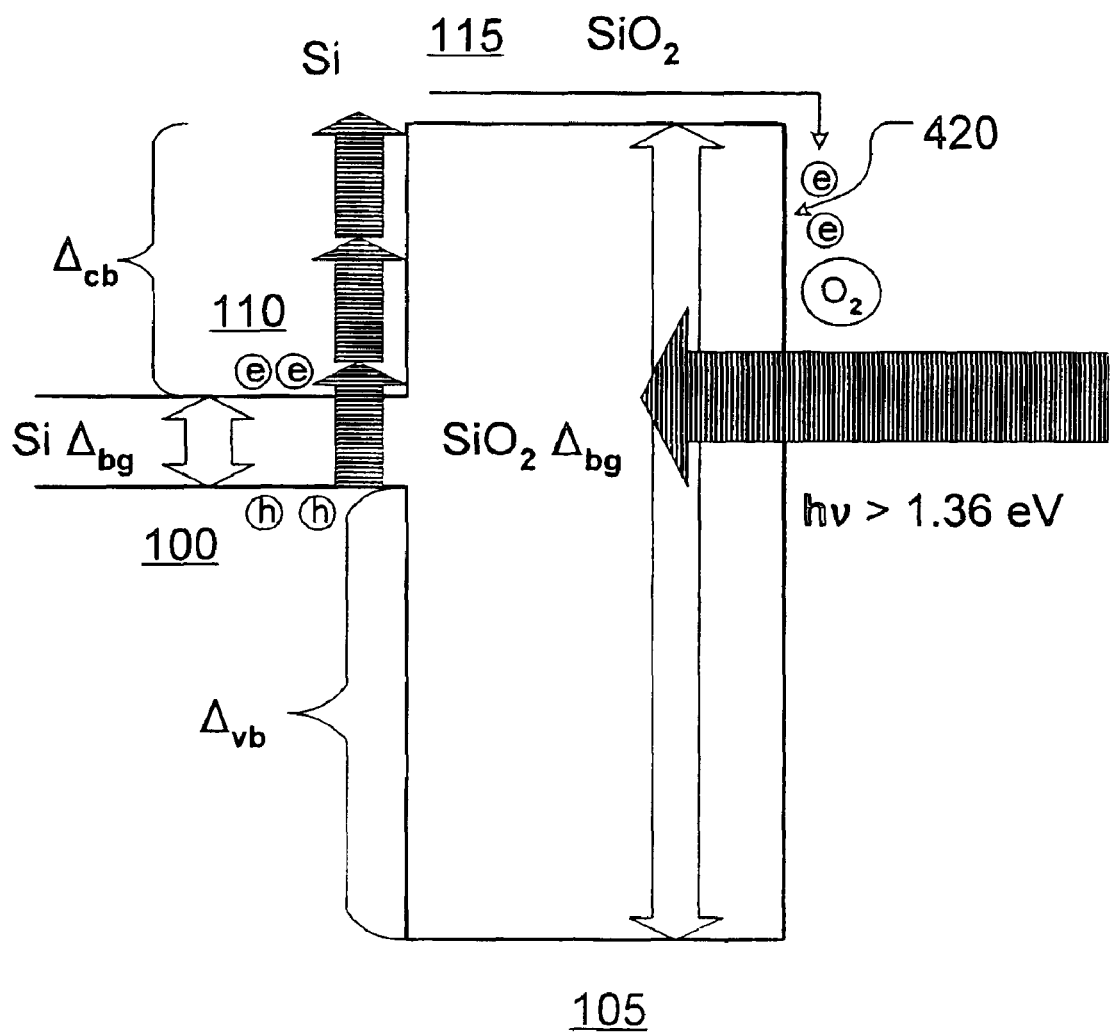
FIG. 6 illustrates schematically multiphoton photo-injection of electrons at a heterointerface.

In various alternative illustrative embodiments, as shown in FIG. 6, for example, when the energy $\hbar\omega$ (hv) of the incident photons (from a pulsed laser source, for example) exceeds approximately 1.36 eV (corresponding to an approximate wavelength $\lambda$=9120 Å), three-photon processes, including cascaded one-photon and two-photon processes, and/or direct three-photon processes, may occur. In particular, three incident photons with energies $\hbar\omega$ (hv) of approximately 1.36 eV each (approximately 4.08 eV total) may excite an electron (e) from the Si valence band 100 into the SiO$_2$ conduction band 115. Indeed, it is believed that the trapping rate for photo-injected electrons, which is proportional to the reciprocal time-dependent second-harmonic generation (TDSHG) rise time, follows approximately an $(I^\omega)^3$ dependence, measured by using a fundamental, incident beam (with an intensity $I^\omega$) having 110 femtosecond (fs) pulses at an approximate wavelength $\lambda$=7700 Å.

When electrons are excited from the Si valence band 100 into the SiO$_2$ conduction band 115 and become trapped, primarily on an SiO$_2$ outer surface 420 in an oxygen (O$_2$) ambient, a charge separation occurs. This charge separation alters the space charge field E(t) in the Si at the buried Si/SiO$_2$ heterointerface. The resulting alteration in the space charge field E(t) may be monitored, using one or more monitor laser beams, either by electric field-induced second-harmonic generation (EFISHG) techniques (see FIG. 2) or by reflective electro-optical sampling (RE-OS) and/or transmissive electro-optical sampling (TE-OS) techniques (see FIG. 3).

The second band-offset may be determined by increasing the photon energy hω (hv) of the pump beam until it passes the threshold for photo-injection of the second type of carriers. The injection of carriers complementary to the ones associated with the lowest band-offset will reduce the charge separation across the heterointerface, and, hence, reduce the space charge field E(t) and the optical signal as well. The photon energy hω (hv) at which this process begins corresponds to the second band-offset.

Figure 7:
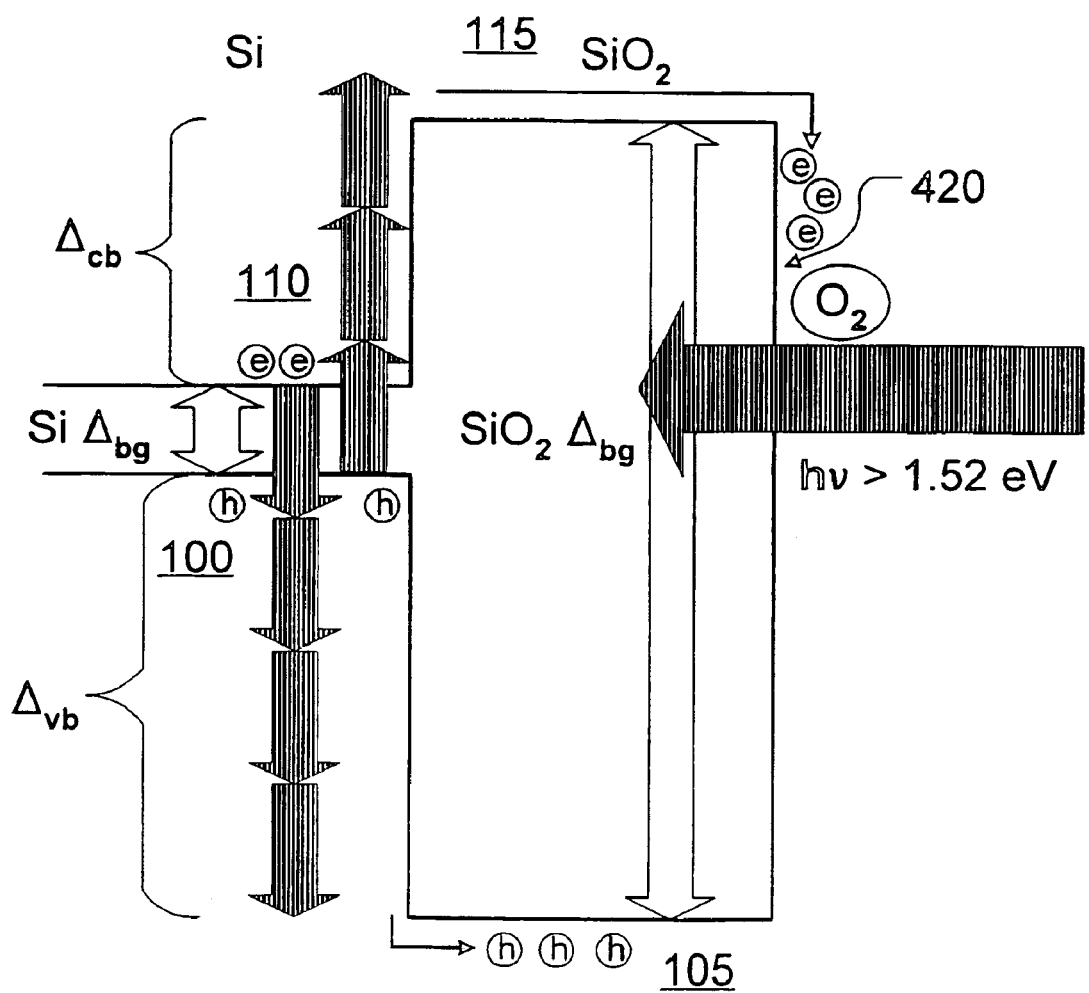
FIG. 7 illustrates schematically multiphoton photo-injection of electrons and holes at a heterointerface.

For example, in these various alternative illustrative embodiments, as shown in FIG. 7, when the energy hω (hv) of the incident photons (from a pulsed laser source, for example) exceeds approximately 1.52 eV (corresponding to an approximate wavelength λ–8160 Å), four-photon processes, including cascaded one-photon, two-photon and three-photon processes, and/or direct four-photon processes, may occur. In particular, four incident photons with energies hω (hv) of approximately 1.52 eV each (approximately 6.08 eV total) may create a hole (h) in the $SiO_2$ valence band 105 (or equivalently, may excite a hole h from the Si conduction band 110 into the $SiO_2$ valence band 105).

The injection of holes into the $SiO_2$ valence band 105 will reduce the charge separation across the buried $Si/SiO_2$ heterointerface, and, hence, reduce the space charge field E(t) in the Si at the buried $Si/SiO_2$ heterointerface and affect the optical signal as well. The resulting reduction in the space charge field E(t) may be monitored, using one or more monitor laser beams, either by electric field-induced second-harmonic generation (EFISHG) techniques (see FIG. 2) or by reflective electro-optical sampling (RE-OS) and/or transmissive electro-optical sampling (TE-OS) techniques (see FIG. 3).

Figure 8:
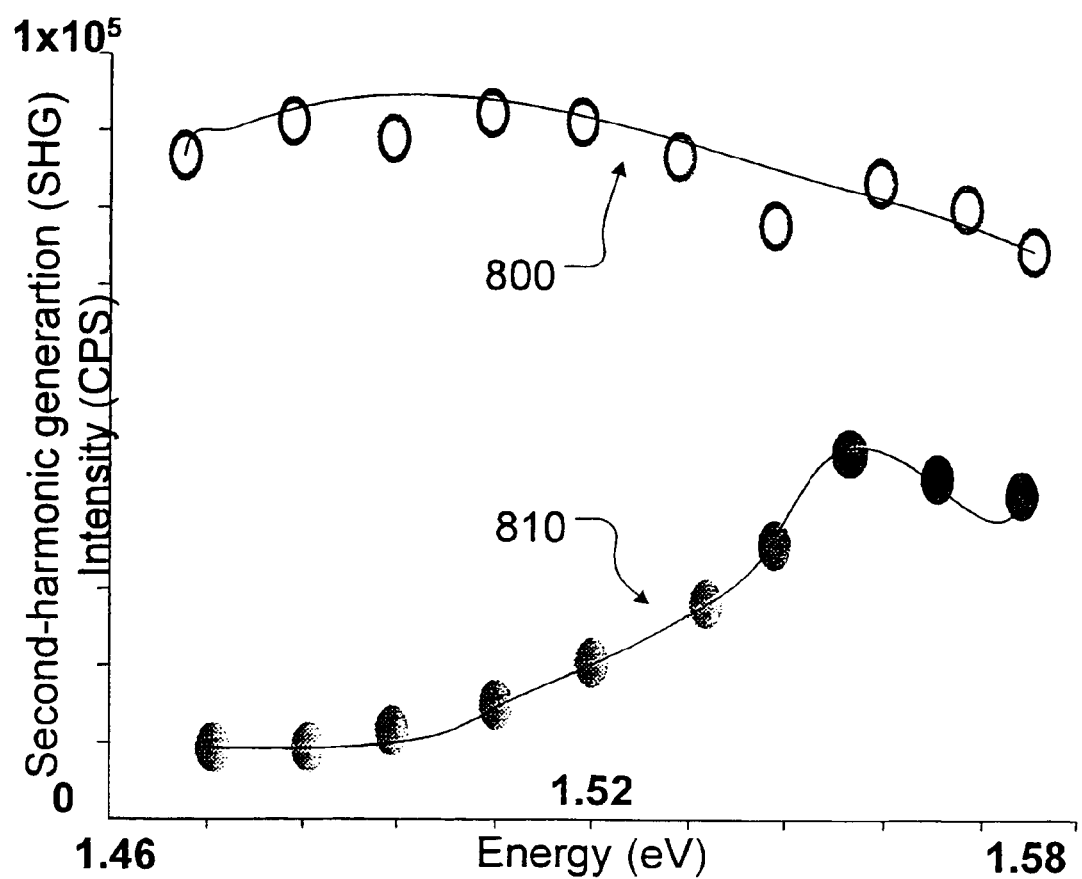
FIG. 8 illustrates schematically determination of a threshold for multiphoton photo-injection of holes at a heterointerface.

FIG. 8 illustrates schematically a determination of a threshold for multiphoton photo-injection of holes at a heterointerface. In particular, FIG. 8 illustrates schematically that the second band-offset may be determined by increasing the photon energy of the pump beam until it passes the threshold for photo-injection of holes (h) into the $SiO_2$ valence band 105.

In one illustrative embodiment, such measurements may be made using optical second-harmonic generation (SHG) techniques (see FIG. 2). The source 200 of substantially monochromatic electromagnetic radiation may be a titanium:sapphire (Ti:sapphire) laser that provides approximately 150 femtosecond (fs) pulses of photons 205 with a wavelength λ in a range tunable from approximately 7000 to 9200 Å (corresponding to photon 205 energies hv in a range of approximately 1.35–1.77 eV) and an average power of approximately 300 mW at a repetition rate of approximately 80 MHz. The photon 205 beam may be focused to approximately 10 microns (μm) in diameter on the $Si/SiO_2$ heterointerface sample 230 on the sample stand 235, and the reflectively emitted second-harmonic photons 265 that have interacted with the space charge field E(t) of the $Si/SiO_2$ heterointerface sample 230 may be measured with approximately 0.5 second temporal resolution by the photomultiplier tube/photon counter 285.

For thermal $SiO_2$ grown on lightly boron-doped (approximately $10^{15}$ cm$^{-3}$) Si(001) wafers to thermal $SiO_2$ thicknesses of approximately 40, 50 and 65 Å, and also for thermal $SiO_2$ grown on lightly boron-doped Si(001) wafers to a thickness of approximately 40 Å that is subsequently etched-back in a dilute hydrogen fluoride (HF) solution to a thickness of approximately 10 Å, a rapid increase in the second-harmonic generation (SHG) signal may be observed for the first few hundred seconds of irradiation. The second-harmonic generation (SHG) signal may then gradually reach a saturation level defined as $\Delta_1$. The energy dependence of the saturation level $\Delta_1$ is illustrated schematically in FIG. 8 by the upper set of data points 800, plotted as a function of the incident photon 205 energy.

The time-dependent second-harmonic generation (TDSHG) generated from the $Si/SiO_2$ heterointerface sample 230 may be described by $I^{2\omega}(t)=|\chi^{(2)}+\chi^{(3)}E(t)|^2(I^\omega)^2$, where $I^\omega$ is the intensity of the incident beam of photons 205, $I^{2\omega}(t)$ is the intensity of the emitted second-harmonic photons 265 that have interacted with the space charge field E(t) of the $Si/SiO_2$ heterointerface sample 230, $\chi^{(3)}$ is the third-order nonlinear susceptibility of Si and $\chi^{(2)}$ is the effective SHG susceptibility from all other sources. The space charge field E(t) is a quasistatic electric field in the Si space charge region at the $Si/SiO_2$ heterointerface of the sample 230.

The space charge field E(t) may arise from a charge separation at the $Si/SiO_2$ heterointerface of the sample 230, the charge separation causing a field substantially perpendicular to at the $Si/SiO_2$ heterointerface of the sample 230. Consequently, the time-dependent second-harmonic generation (TDSHG) techniques of various embodiments of the present invention provide a direct contactless method of probing electric fields at heterointerfaces, such as the $Si/SiO_2$ heterointerface of the sample 230. As described above, when electrons (e) are excited from the Si valence band 100 into the $SiO_2$ conduction band 115 and become trapped, primarily on the $SiO_2$ outer surface 420 in an oxygen ($O_2$) ambient, a charge separation occurs. This charge separation alters the space charge field E(t) in the Si at the buried $Si/SiO_2$ heterointerface. The resulting alteration in the space charge field E(t) may be monitored, using one or more monitor laser beams, either by electric field-induced second-harmonic generation (EFISHG) techniques (see FIG. 2) or by reflective electro-optical sampling (RE-OS) and/or transmissive electro-optical sampling (TE-OS) techniques (see FIG. 3).

For thermal $SiO_2$ grown on lightly boron-doped (approximately $10^{15}$ cm$^3$) Si(001) wafers to thicknesses of at least approximately 40 Å, we have observed a new and scientifically revealing phenomenon that involves a pronounced increase in the time-dependent second-harmonic generation (TDSHG) signal after the excitation beam generated by the source 200 of substantially monochromatic electromagnetic radiation, for example, the Ti:sapphire laser having a wavelength λ of approximately 7900 Å (corresponding to photon 205 energies hv of approximately 1.57 eV), has been blocked for several seconds and then unblocked. For example, after about 600 seconds of irradiation, the excitation beam may be blocked (or, alternatively, and equivalently, switched off) for about 100 seconds and then the excitation beam may be unblocked (or, alternatively, and equivalently, switched on). Surprisingly, the initial reading of the time-dependent second-harmonic generation (TDSHG) signal may be observed to be higher than before the excitation beam was blocked (or, alternatively, and equivalently, switched off). The enhanced time-dependent second-harmonic generation (TDSHG) signal may be observed to then decrease in a few tens of seconds to the former saturation level A1 and follow the saturation trend thereafter, until a subsequent blockage of the excitation beam, in which case the beam-off, dark field enhancement may again be observed.

The magnitude of this beam-off, dark field enhancement may be defined as $\Delta_2$. The energy dependence of the beam-off, dark field enhancement $\Delta_2$ is illustrated schematically in FIG. 8 by the lower set of data points 810, plotted as a function of the incident photon 205 energy. Note that the lower set of data points 810 indicates that the beam-off, dark field enhancement $\Delta_2$ does not occur substantially until the incident photon 205 energy has exceeded a photon energy threshold of approximately 1.52 eV.

Figure 9:
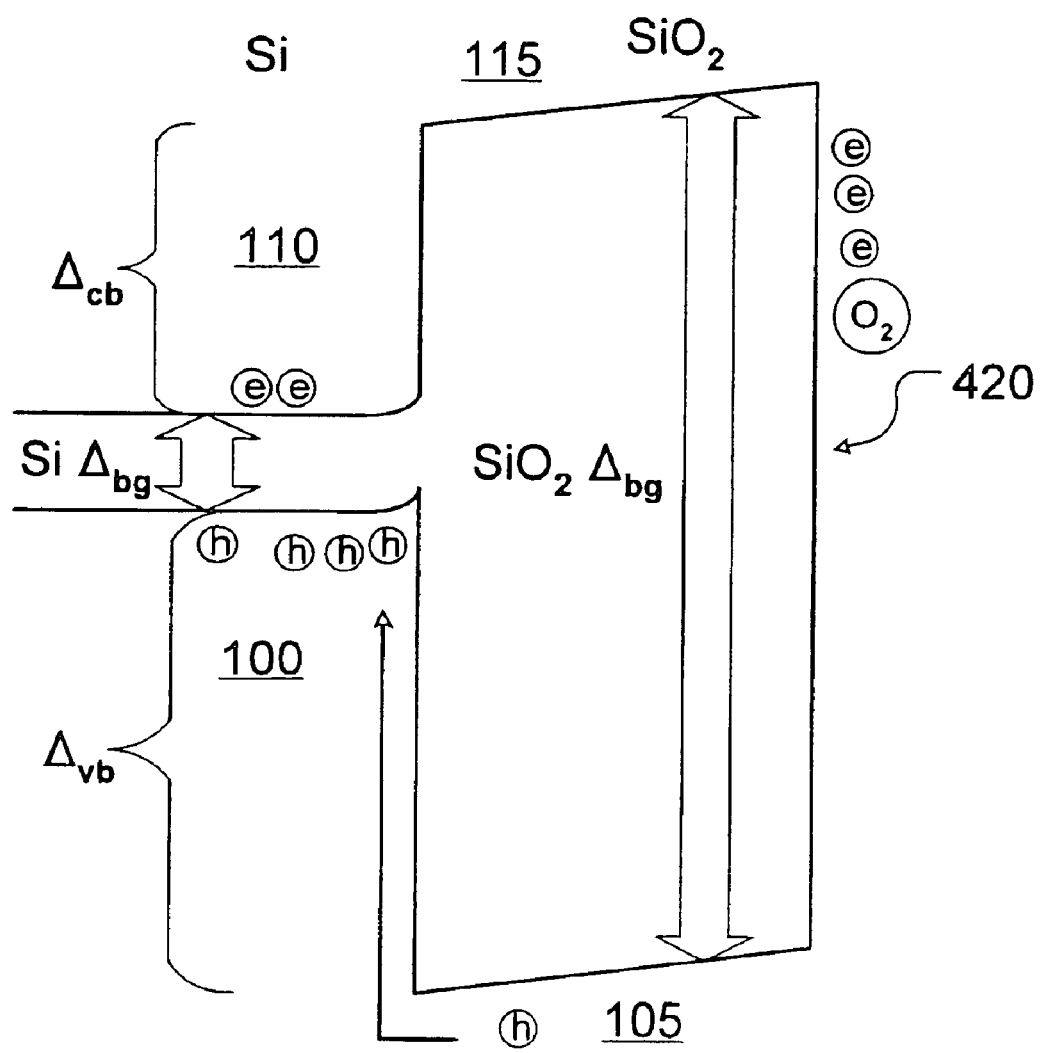
FIG. 9 illustrates schematically holes crossing a heterointerface under beam-off, dark field conditions.

By way of contrast, for the thermal $SiO_2$ grown on lightly boron-doped Si(001) wafers to a thickness of approximately 40 Å that is subsequently etched-back in a dilute hydrogen fluoride (HF) solution to a thickness of approximately 10 Å, the beam-off, the time-dependent second-harmonic generation (TDSHG) response shows that the dark field enhancement $\Delta_2$ does not occur. In fact, in this case, the beam-off, dark field may be drastically lowered in magnitude. Consequently, we conclude that as a general feature the newly observed dark field enhancement $\Delta_2$ is pronounced for $SiO_2$ films that exceed a thickness of approximately 30–40 Å. For thinner $SiO_2$ films, the hole-related effect (see FIGS. 7 and 9) is less apparent due to fast electron (e) detrapping (from the $SiO_2$ film outer surface 420 in the $O_2$ ambient) that neutralizes the holes (h) trapped in the $SiO_2$ film and at the $Si/SiO_2$ heterointerface.

As shown in FIG. 8, the saturation level $\Delta_1$ decreases with increasing incident photon 205 energy. By way of contrast, the dark field enhancement $\Delta_2$ increases with increasing incident photon 205 energy, at least when the incident photon 205 energy has exceeded the photon energy threshold of approximately 1.52 eV. In addition, the sum of the saturation level $\Delta_1$ and the dark field enhancement $\Delta_2$ remains substantially constant, after the incident photon 205 energy has exceeded the photon energy threshold of approximately 1.52 eV, consistent with charge conservation and our hole-injection model, as described in more detail below. Moreover, below the photon energy threshold of approximately 1.52 eV, the saturation level $\Delta_1$, which we believe may be attributed substantially to electron-injection behavior (see FIG. 4), is substantially maximized.

We believe that the above observations may be interpreted consistently as follows. As shown in FIGS. 1, 6 and 7, the $Si/SiO_2$ heterointerface of the sample 230 exhibits two band-offsets associated with the conduction bands ($\Delta_{cb}$) and the valence bands ($\Delta_{vb}$). These two band discontinuities, $\Delta_{cb}$ and $\Delta_{vb}$, are different, with the band-offset $\Delta_{cb}$ being approximately 2.98 eV and with the band-offset $\Delta_{vb}$ being approximately 4.98 eV. These values may be determined as follows. As shown in FIG. 4, three incident photons 205 with energies $h\omega$ (hv) of approximately 1.36 eV each (approximately 4.08 eV total) may excite an electron (e) from the Si valence band 100 into the $SiO_2$ conduction band 115. Since the bandgap $\Delta_{bg}$ in Si is about 1.1 eV, and the sum of the bandgap $\Delta_{bg}$ in Si and the band-offset $\Delta_{cb}$ is approximately 4.08 eV, the band-offset $\Delta_{cb}$ is approximately 2.98 eV. Similarly, as shown in FIG. 5, four incident photons 205 with energies ho (hv) of approximately 1.52 eV each (approximately 6.08 eV total) may excite a hole (h) from the Si conduction band 110 into the $SiO_2$ valence band 105. Since the bandgap $\Delta_{bg}$ in Si is about 1.1 eV, and the sum of the bandgap $\Delta_{bg}$ in Si and the band-offset $\Delta_{vb}$ is approximately 6.08 eV, the band-offset $\Delta_{vb}$ is approximately 4.98 eV.

This enables photo-injection of only electrons (e) by increasing the incident photon 205 energy $h\omega$ above approximately 1.36 eV (one-third of the sum of the bandgap $\Delta_{bg}$ in Si and the lowest band-offset $\Delta_{cb}$), while keeping the incident photon 205 energy $h\omega$ below approximately 1.52 eV (one-quarter of the sum of the bandgap $\Delta_{bg}$ in Si and the highest band-offset $\Delta_{vb}$). Because of the significant difference in transition probabilities between a three-photon process (see FIG. 4) and a four-photon process (see FIG. 5), the photo-excitation of electrons (e) is strongly favored. Consequently, the initial feature of the time-dependent second-harmonic generation (TDSHG) signal is dominated by photo-injection of hot electrons (e), even though there may be some holes (h) that are photo-excited into the $SiO_2$ as well, and even though there may be some recombination of photo-injected electrons (e) with photo-injected holes (h).

However, when the incident photon 205 energy $h\omega$ is below approximately 1.52 eV (one-quarter of the sum of the bandgap $\Delta_{bg}$ in Si and the highest band-offset $\Delta_{vb}$), hot holes (h) generally are not photo-injected into the $SiO_2$ and the dynamical behavior is determined substantially by the hot electrons (e) photo-injected into the $SiO_2$. This may explain why, when the incident photon 205 energy $h\omega$ (hv) is above approximately 1.52 eV (one-quarter of the sum of the bandgap $\Delta_{bg}$ in Si and the highest band-offset $\Delta_{vb}$), the saturation level $\Delta_1$ decreases with increasing incident photon 205 energy since the total space charge field E(t) at the $Si/SiO_2$ heterointerface is lessened due to the photo-injection of hot holes (h) into the $SiO_2$.

During the photo-injection of hot electrons (e) and hot holes (h) into $SiO_2$, several things may happen. The density of electron traps, particularly in thermally grown bulk $SiO_2$, may be quite small, so that considerably less than about 1% of the hot electrons (e) photo-injected at room temperature will therefore be trapped in the insulating $SiO_2$. Since electrons (e) have a normal mobility of about 0.002 $m^2$Ns, the hot electrons (e) photo-injected at room temperature will leave the bulk $SiO_2$, very fast (within picoseconds) either to the Si or to the $SiO_2$ outer surface 420. Due to the $O_2$ ambient at the $SiO_2$ outer surface 420, some of the photo-injected hot electrons (e) may eventually travel to the $SiO_2$ outer surface 420 and become trapped. For thick $SiO_2$ (with a thickness at least about 30–40 Å), the trapped photo-injected hot electrons (e) may remain on the $SiO_2/O_2$ ambient interface at the $SiO_2$ outer surface 420 after the incident excitation photon 205 beam has been switched off and/or blocked.

For $SiO_2$ below a critical thickness at most about 30–40 Å, the trapped photo-injected hot electrons (e) may quantum mechanically tunnel back from the $SiO_2/O_2$ ambient interface at the $SiO_2$ outer surface 420 to the Si, and combine with holes (h) in the Si, after the incident excitation photon 205 beam has been switched off and/or blocked. Consequently, the charge separation and the corresponding time-dependent second-harmonic generation (TDSHG) signal behave very differently, depending on the thickness of the $SiO_2$, following the switching off and on (and/or blocking and unblocking) of the incident excitation photon 205 beam.

In contrast to the photo-injected hot electrons (e), the hot holes (h) photo-injected into the $SiO_2$ behave quite differently. Hole transport is highly variable, with a very low apparent mobility of about $10^{-10}$ $m^2$/Vs. Models explaining this type of hole (h) transport assume a large density of shallow hole traps. The holes (h) are assumed to move either by quantum mechanically tunneling between localized states (hole traps) or by becoming trapped and then reemitted into the valence band 100 of the Si with a large time constant dispersion due to the distribution in hole trap depths. Hole traps are believed to be more abundant in thermally grown bulk $SiO_2$ than electron traps, and since the hole traps also have larger cross-sections, a substantial fraction of the hot holes (h) photo-injected into the $SiO_2$ may be captured. It is believed that as many as about 10% of the hot holes (h)

photo-injected into the $SiO_2$ at room temperature may become trapped in the $SiO_2$ close to the $Si/SiO_2$ heterointerface.

As a result of these considerations, we suggest that in the presence of the incident photon 205 beam with photon energies $\hbar\omega$ (hv) of at least approximately 1.52 eV, a substantial proportion of the hot holes (h) photo-injected into the $SiO_2$, having surmounted both the bandgap $\Delta_{bg}$ in Si (approximately 1.1 eV) and the band-offset $\Delta_{vb}$ (approximately 4.98 eV) and crossed into the $SiO_2$, may remain close to the $Si/SiO_2$ heterointerface. Consequently, these photo-injected hot holes (h) may readily move back to the Si when the incident photon 205 beam (with photon energies $\hbar\omega$ or hv of at least approximately 1.52 eV) is switched off and/or blocked, as shown in FIG. 7, for example. FIG. 7 illustrates schematically the photo-injected hot holes (h) crossing the $Si/SiO_2$ heterointerface back into the Si under dark conditions (the incident photon 205 beam switched off and/or blocked), leading to the enhancement of the space charge field E(t), as monitored, using one or more monitor laser beams, by time-dependent second-harmonic generation (TDSHG) and the dark field enhancement $\Delta_2$, for example, arising from the increased charge separation at the $Si/SiO_2$ heterointerface.

After again switching on and/or unblocking the incident photon 205 beam (with photon energies $\hbar\omega$ or hv of at least approximately 1.52 eV), hot holes (h) may again be photo-injected across the $Si/SiO_2$ heterointerface back into the $SiO_2$. On the other hand, relatively few hot electrons (e) may be photo-injected across the $Si/SiO_2$ heterointerface into the $SiO_2$, after again switching on and/or unblocking the incident photon 205 beam (with photon energies $\hbar\omega$ or hv of at least approximately 1.52 eV), because any newly photo-injected hot electrons (e) would have to drift against an already strong space charge field E(t) created by the trapped photo-injected hot electrons (e) that may remain on the $SiO_2$ outer surface 420 at the $SiO_2/O_2$ ambient interface. Consequently, there are more hot holes (h) than hot electrons (e) moving from the Si into the $SiO_2$ after the incident photon 205 beam (with photon energies $\hbar\omega$ or hv of at least approximately 1.52 eV) is again switched on and/or unblocked. This reduces the charge separation. Therefore, the space charge field E(t) and the time-dependent second-harmonic generation (TDSHG) signal may decrease to near the previous saturation level $\Delta_1$ when the incident photon 205 beam (with photon energies $\hbar\omega$ or hv of at least approximately 1.52 eV) is again switched on and/or unblocked.

The new optical techniques of various illustrative embodiments of the present invention allow contactless measurements of valence and conduction band-offsets at semiconductor/dielectric heterointerfaces and monitor changes of the space charge field E(t) in the semiconductor region at the buried heterointerface caused by photo-injection of carriers into the dielectric. This may be accomplished by utilizing either the linear electro-optical (e.g., the Pockels effect) or higher-order nonlinear-optical response (e.g., second-harmonic generation or SHG) of the semiconductor material. In contrast to synchrotron and X-ray photoemission spectroscopy, which employ photons with energies of the order of several tens of eV, the new optical techniques of various embodiments of the present invention use light with photon energies of a few eV. This allows the determination of band-offsets with an accuracy of a few meV, an improvement of at least one order of magnitude compared to previous uncertainties. Furthermore, the new optical techniques of various illustrative embodiments of the present invention may be employed for measuring the conduction band-offset, which is not possible with single-photon photoemission spectroscopy, where electrons are ejected into the vacuum and not into the conduction band.

Internal photoemission spectroscopy, which can be used for measuring both valence and conduction band-offsets, on the other hand, requires electrical contacts on the device under test to measure the photo-generated current in an external circuit. In addition, for using internal photoemission the semiconductor has to be doped p-type or n-type to measure the valence or conduction band-offset, respectively. This is not required for the new optical techniques of various illustrative embodiments of the present invention. Since these purely optical techniques are contactless, non-invasive, and have very fast response times (of the order of microseconds), they may be used as an efficient in-situ control for the growth of ultrathin dielectric layers on semiconductors, e.g., in CMOS processing. For example, ultrathin dielectric layers, with thicknesses ranging from a few Angstroms (Å) to hundreds of Å, may be measured in-situ, and controlled, while growing on semiconductors.

Embodiments of the present invention allow contactless measurements of the band-offsets at the heterointerface of an ultrathin dielectric on a wide variety of semiconductors, including Si, Ge, GaAs and InP. The energy resolution of illustrative embodiments is a few meV. Dielectrics with thicknesses ranging from a few Angstroms (Å) to hundreds of Å may be measured.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of determining first and second band-offsets at a semiconductor/dielectric heterointerface, the method comprising:

exposing the semiconductor/dielectric heterointerface to incident photons;

generating a signal by detecting emitted photons that have interacted with the semiconductor/dielectric heterointerface;

changing the energy of the incident photons and monitoring the signal to determine a first threshold energy for injection of first carriers into the dielectric of the semiconductor/dielectric heterointerface, the first threshold energy corresponding to the first band-offset; and changing the energy of the incident photons beyond the first threshold energy and monitoring the signal to determine a second threshold energy for injection of second carriers into the dielectric of the semiconductor/dielectric heterointerface, the second threshold energy corresponding to the second band-offset.

2. The method of claim 1, wherein exposing the semiconductor/dielectric heterointerface to the incident photons comprises exposing the semiconductor/dielectric heterointerface to substantially monochromatic electromagnetic radiation.

3. The method of claim 2, wherein exposing the semiconductor/dielectric heterointerface to the substantially monochromatic electromagnetic radiation comprises exposing the semiconductor/dielectric heterointerface to at least one of ultraviolet light and a laser beam.

4. The method of claim 3, wherein exposing the semiconductor/dielectric heterointerface to the at least one of the ultraviolet light and the laser beam comprises exposing the semiconductor/dielectric heterointerface to a pulsed laser beam.

5. The method of claim 1, wherein exposing the semiconductor/dielectric heterointerface to the incident photons comprises exposing the semiconductor/dielectric heterointerface to at least one of ultraviolet light and a pump laser beam and exposing the semiconductor/dielectric heterointerface to a monitor laser beam, generating the signal by detecting the emitted photons that have interacted with the semiconductor/dielectric heterointerface comprises detecting the emitted photons from the monitor laser beam that have interacted with a space charge field, and changing the energy of the incident photons comprises changing the energy of the incident photons of the at least one of the ultraviolet light and the pump laser beam.

6. The method of claim 5, wherein exposing the semiconductor/dielectric heterointerface to the at least one of the ultraviolet light and the pump laser beam and exposing the semiconductor/dielectric heterointerface to the monitor laser beam comprises exposing the semiconductor/dielectric heterointerface to a pulsed pump laser beam and a pulsed monitor laser beam.

7. The method of claim 5, wherein exposing the semiconductor/dielectric heterointerface to the at least one of the ultraviolet light and the pump laser beam and exposing the semiconductor/dielectric heterointerface to the monitor laser beam comprises exposing the semiconductor/dielectric heterointerface to the pump laser beam comprising a tunable titanium sapphire laser beam and exposing the semiconductor/dielectric heterointerface to the monitor laser beam comprising a tunable free electron laser beam.

8. The method of claim 7, wherein exposing the semiconductor/dielectric heterointerface to the pump laser beam comprising the tunable titanium sapphire laser beam and exposing the semiconductor/dielectric heterointerface to the monitor laser beam comprising the tunable free electron laser beam comprises exposing the semiconductor/dielectric heterointerface to a pulsed pump laser beam and a pulsed monitor laser beam and using the pulsed pump laser beam and the pulsed monitor laser beam to probe lifetimes, relaxation times and decay times of states associated with the semiconductor/dielectric heterointerface.

9. The method of claim 1, wherein generating the signal by detecting the emitted photons that have interacted with the semiconductor/dielectric heterointerface comprises detecting the emitted photons that have interacted with a space charge field.

10. The method of claim 9, wherein monitoring the signal to determine the first threshold energy comprises monitoring the signal to detect a time-dependent change in the space charge field.

11. The method of claim 10, wherein monitoring the signal to detect the time-dependent change in the space charge field comprises monitoring the signal to detect an increase in the space charge field.

12. The method of claim 10, wherein monitoring the signal to detect the time-dependent change in the space charge field comprises monitoring the signal to detect a decrease in the space charge field.

13. The method of claim 9, wherein detecting the emitted photons that have interacted with the space charge field comprises detecting the emitted photons reflected from the semiconductor/dielectric heterointerface.

14. The method of claim 9, wherein detecting the emitted photons that have interacted with the space charge field comprises detecting the emitted photons transmitted through the semiconductor/dielectric heterointerface.

15. The method of claim 9, wherein detecting the emitted photons that have interacted with the space charge field comprises detecting the emitted photons that have interacted with the space charge field using the Pockels effect.

16. The method of claim 15, wherein detecting the emitted photons that have interacted with the space charge field using the Pockels effect comprises detecting a polarization state of the emitted photons that have interacted with the space charge field.

17. The method of claim 9, wherein detecting the emitted photons that have interacted with the space charge field comprises detecting the emitted photons that have interacted with the space charge field using a second-harmonic response.

18. The method of claim 17, wherein detecting the emitted photons that have interacted with the space charge field using the second-harmonic response comprises detecting the emitted photons that have interacted with the space charge field using a time-dependent second-harmonic response.

19. The method of claim 18, wherein detecting the emitted photons that have interacted with the space charge field using the time-dependent second-harmonic response comprises detecting the emitted photons that have interacted with the space charge field using the time-dependent second-harmonic response after blocking the exposure of the semiconductor/dielectric heterointerface to the incident photons for a period of time and then exposing the semiconductor/dielectric heterointerface to the incident photons again.

20. The method of claim 19, wherein using the time-dependent second-harmonic response comprises detecting a thickness of the dielectric layer of the semiconductor/dielectric heterointerface.

21. The method of claim 1, wherein generating the signal by detecting the emitted photons that have interacted with the semiconductor/dielectric heterointerface comprises detecting the emitted photons that have interacted with a piezoelectric effect field.

22. The method of claim 1, wherein generating the signal by detecting the emitted photons that have interacted with the semiconductor/dielectric heterointerface comprises detecting the emitted photons that have interacted with at least one of an external electric field and an external magnetic field.

23. A method for contactless measurement of first and second band-offsets at a semiconductor/dielectric heterointerface, the method comprising:
    exposing the semiconductor/dielectric heterointerface to incident photons generated by a tunable substantially monochromatic electromagnetic radiation source;
    generating a signal by detecting emitted photons that have interacted with a space charge field at the semiconductor/dielectric heterointerface;
    changing the energy of the incident photons and monitoring the signal to determine a first threshold energy for injection of first carriers into the dielectric of the semiconductor/dielectric heterointerface, the first threshold energy corresponding to the first band-offset; and
    changing the energy of the incident photons beyond the first threshold energy and monitoring the signal to determine a second threshold energy for injection of second carriers into the dielectric of the semiconductor/dielectric heterointerface, the second threshold energy corresponding to the second band-offset.

24. The method of claim 23, wherein exposing the semiconductor/dielectric heterointerface to the tunable substantially monochromatic electromagnetic radiation source comprises exposing the semiconductor/dielectric heterointerface to at least one of ultraviolet light and a pulsed laser beam.

25. The method of claim 23, wherein monitoring the signal to determine the first threshold energy comprises monitoring the signal to detect a time-dependent change in the space charge field.

26. The method of claim 25, wherein monitoring the signal to detect the time-dependent change in the space charge field comprises monitoring the signal to detect an increase in the space charge field.

27. The method of claim 25, wherein monitoring the signal to detect the time-dependent change in the space charge field comprises monitoring the signal to detect a decrease in the space charge field.

28. The method of claim 23, wherein detecting the emitted photons that have interacted with the space charge field comprises detecting the emitted photons reflected from the semiconductor/dielectric heterointerface.

29. The method of claim 23, wherein detecting the emitted photons that have interacted with the space charge field comprises detecting the emitted photons transmitted through the semiconductor/dielectric heterointerface.

30. The method of claim 23, wherein detecting the emitted photons that have interacted with the space charge field comprises detecting the emitted photons that have interacted with the space charge field using the Pockels effect.

31. The method of claim 30, wherein detecting the emitted photons that have interacted with the space charge field using the Pockels effect comprises detecting a polarization state of the emitted photons that have interacted with the space charge field.

32. The method of claim 23, wherein detecting the emitted photons that have interacted with the space charge field comprises detecting the emitted photons that have interacted with the space charge field using a second-harmonic response.

33. The method of claim 32, wherein detecting the emitted photons that have interacted with the space charge field using the second-harmonic response comprises detecting the emitted photons that have interacted with the space charge field using a time-dependent second-harmonic response.

34. The method of claim 33, wherein detecting the emitted photons that have interacted with the space charge field using the time-dependent second-harmonic response comprises detecting the emitted photons that have interacted with the space charge field using the time-dependent second-harmonic response after blocking the exposure of the semiconductor/dielectric heterointerface to the incident photons for a period of time and then exposing the semiconductor/dielectric heterointerface to the incident photons again.

35. The method of claim 34, wherein using the time-dependent second-harmonic response comprises detecting a thickness of the dielectric layer of the semiconductor/dielectric heterointerface.

36. A method of determining first and second band-offsets at a plurality of heterointerfaces between layers having different bandgaps, the method comprising:
exposing the plurality of heterointerfaces to incident photons;
generating a signal by detecting emitted photons that have interacted with the plurality of heterointerfaces;
changing the energy of the incident photons and monitoring the signal to determine a first threshold energy for injection of first carriers into one of the layers having a larger bandgap, the first threshold energy corresponding to the first band-offset; and
changing the energy of the incident photons beyond the first threshold energy and monitoring the signal to determine a second threshold energy for injection of second carriers into the one of the layers having a larger bandgap, the second threshold energy corresponding to the second band-offset.

37. The method of claim 36, wherein exposing the plurality of heterointerfaces to the incident photons comprises exposing the plurality of heterointerfaces to substantially monochromatic electromagnetic radiation.

38. The method of claim 37, wherein exposing the plurality of heterointerfaces to the substantially monochromatic electromagnetic radiation comprises exposing the plurality of heterointerfaces to at least one of ultraviolet light and a laser beam.

39. The method of claim 38, wherein exposing the plurality of heterointerfaces to at least one of the ultraviolet light and the laser beam comprises exposing the plurality of heterointerfaces to a pulsed laser beam.

40. The method of claim 36, wherein exposing the plurality of heterointerfaces to incident photons comprises exposing the plurality of heterointerfaces to at least one of ultraviolet light and a pump laser beam and exposing the plurality of heterointerfaces to a monitor laser beam, generating the signal by detecting the emitted photons that have interacted with the plurality of heterointerfaces comprises detecting the emitted photons from the monitor laser beam that have interacted with a space charge field, and changing the energy of the incident photons comprises changing the energy of the incident photons of the at least one of the ultraviolet light and the pump laser beam.

41. The method of claim 40, wherein exposing the plurality of heterointerfaces to the at least one of the ultraviolet light and the pump laser beam and exposing the plurality of heterointerfaces to the monitor laser beam comprises exposing the plurality of heterointerfaces to a pulsed pump laser beam and a pulsed monitor laser beam.

42. The method of claim 36, wherein generating the signal by detecting the emitted photons that have interacted with the plurality of heterointerfaces comprises detecting the emitted photons that have interacted with a space charge field.

43. The method of claim 42, wherein monitoring the signal to determine the first threshold energy comprises monitoring the signal to detect a time-dependent change in the space charge field.

44. The method of claim 43, wherein monitoring the signal to detect the time-dependent change in the space charge field comprises monitoring the signal to detect an increase in the space charge field.

45. The method of claim 43, wherein monitoring the signal to detect the time-dependent change in the space charge field comprises monitoring the signal to detect a decrease in the space charge field.

46. The method of claim 42, wherein detecting the emitted photons that have interacted with the space charge field comprises detecting the emitted photons reflected from the plurality of heterointerfaces.

47. The method of claim 42, wherein detecting the emitted photons that have interacted with the space charge field comprises detecting the emitted photons transmitted through the plurality of heterointerfaces.

48. The method of claim 42, wherein detecting the emitted photons that have interacted with the space charge field comprises detecting the emitted photons that have interacted with the space charge field using the Pockels effect.

49. The method of claim 48, wherein detecting the emitted photons that have interacted with the space charge field using the Pockels effect comprises detecting a polarization state of the emitted photons that have interacted with the space charge field.

50. The method of claim 42, wherein detecting the emitted photons that have interacted with the space charge field comprises detecting the emitted photons that have interacted with the space charge field using a second-harmonic response.

51. The method of claim 50, wherein detecting the emitted photons that have interacted with the space charge field using the second-harmonic response comprises detecting the emitted photons that have interacted with the space charge field using a time-dependent second-harmonic response.

52. The method of claim 51, wherein detecting the emitted photons that have interacted with the space charge field using the time-dependent second-harmonic response comprises detecting the emitted photons that have interacted with the space charge field using the time-dependent second-harmonic response after blocking the exposure of the plurality of heterointerfaces to the incident photons for a period of time and then exposing the plurality of heterointerfaces to the incident photons again.

53. The method of claim 52, wherein using the time-dependent second-harmonic response comprises detecting a thickness of one of the layers between the plurality of heterointerfaces.

54. The method of claim 36, wherein generating the signal by detecting the emitted photons that have interacted with the plurality of heterointerfaces comprises detecting the emitted photons that have interacted with a piezoelectric effect field.

55. The method of claim 36, wherein generating the signal by detecting the emitted photons that have interacted with the plurality of heterointerfaces comprises detecting the emitted photons that have interacted with at least one of an external electric field and an external magnetic field.

56. The method of claim 36, wherein exposing the plurality of heterointerfaces between layers having different bandgaps to incident photons comprises exposing the plurality of heterointerfaces between alternating layers of semiconductor and dielectric material having the different bandgaps to incident photons.

57. The method of claim 36, wherein exposing the plurality of heterointerfaces between layers having different bandgaps to incident photons comprises exposing the plurality of heterointerfaces between alternating layers of first and second semiconductor materials having the different bandgaps to incident photons.

58. The method of claim 57, wherein exposing the plurality of heterointerfaces between alternating layers of first and second semiconductor materials having the different bandgaps to incident photons comprises exposing quantum wells to incident photons.

59. The method of claim 36, wherein exposing the plurality of heterointerfaces between layers having different bandgaps to incident photons comprises exposing the plurality of heterointerfaces between alternating layers of metal and semiconductor material having the different bandgaps to incident photons.

60. The method of claim 36, wherein exposing the plurality of heterointerfaces between layers having different bandgaps to incident photons comprises exposing the plurality of heterointerfaces between alternating layers of metal and dielectric material having the different bandgaps to incident photons.

61. A device to determine first and second band-offsets at a semiconductor/dielectric heterointerface, the device comprising:
a source of incident photons exposing the semiconductor/dielectric heterointerface to the incident photons; and
a detector generating a signal by detecting emitted photons that have interacted with the semiconductor/dielectric heterointerface, wherein the energy of the incident photons is changeable and the signal is monitorable to determine a first threshold energy for injection of first carriers into the dielectric of the semiconductor/dielectric heterointerface, the first threshold energy corresponding to the first band-offset, and wherein the energy of the incident photons is changeable beyond the first threshold energy and the signal is monitorable to determine a second threshold energy for injection of second carriers into the dielectric of the semiconductor/dielectric heterointerface, the second threshold energy corresponding to the second band-offset.

62. The device of claim 61, wherein the incident photons comprise substantially monochromatic electromagnetic radiation.

63. The device of claim 62, wherein the substantially monochromatic electromagnetic radiation comprises at least one of ultraviolet light and a laser beam.

64. The device of claim 63, wherein the at least one of the ultraviolet light and the laser beam comprises a pulsed laser beam.

65. The device of claim 61, wherein the incident photons comprise at least one of ultraviolet light and a pump laser beam and the incident photons further comprise a monitor laser beam, the signal generated by detecting the emitted photons that have interacted with the semiconductor/dielectric heterointerface comprises a monitor laser beam signal generated by detecting the emitted photons from the monitor laser beam that have interacted with a space charge field, and the energy of the incident photons is changeable by changing the energy of the incident photons of the at least one of the ultraviolet light and the pump laser beam.

66. The device of claim 65, wherein the incident photons comprise a pulsed pump laser beam and a pulsed monitor laser beam.

67. The device of claim 61, wherein the signal generated by detecting the emitted photons that have interacted with the semiconductor/dielectric heterointerface comprises a space charge field signal generated by detecting the emitted photons that have interacted with a space charge field.

68. The device of claim 67, wherein the space charge field signal is monitorable to determine the first threshold energy by monitoring the space charge field signal to detect a time-dependent change in the space charge field.

69. The device of claim 68, wherein the space charge field signal is monitorable to detect the time-dependent change in the space charge field by monitoring the space charge field signal to detect an increase in the space charge field.

70. The method of claim 68, wherein the space charge field signal is monitorable to detect the time-dependent change in the space charge field by monitoring the space charge field signal to detect a decrease in the space charge field.

71. The device of claim 67, wherein the detector detecting the emitted photons that have interacted with the space charge field detects reflected emitted photons reflected from the semiconductor/dielectric heterointerface.

72. The device of claim 67, wherein the detector detecting the emitted photons that have interacted with the space charge field detects transmitted emitted photons transmitted through the semiconductor/dielectric heterointerface.

73. The device of claim 67, wherein the detector detecting the emitted photons that have interacted with the space charge field detects the emitted photons that have interacted with the space charge field using the Pockels effect.

74. The device of claim 73, wherein the detector detecting the emitted photons that have interacted with the space charge field using the Pockels effect detects a polarization state of the emitted photons that have interacted with the space charge field.

75. The device of claim 67, wherein the detector detecting the emitted photons that have interacted with the space charge field detects the emitted photons that have interacted with the space charge field using a second-harmonic response.

76. The device of claim 75, wherein the detector detecting the emitted photons that have interacted with the space charge field using the second-harmonic response detects the emitted photons that have interacted with the space charge field using a time-dependent second-harmonic response.

77. The device of claim 76, wherein the detector detecting the emitted photons that have interacted with the space charge field using the time-dependent second-harmonic response detects the emitted photons that have interacted with the space charge field using the time-dependent second-harmonic response after blocking the exposure of the semiconductor/dielectric heterointerface to the incident photons for a period of time and then exposing the semiconductor/dielectric heterointerface to the incident photons again.

78. The device of claim 77, wherein the detector using the time-dependent second-harmonic response detects a thickness of the dielectric layer of the semiconductor/dielectric heterointerface.

79. The device of claim 61, wherein the signal generated by detecting the emitted photons that have interacted with the semiconductor/dielectric heterointerface comprises a piezoelectric effect field signal generated by detecting the emitted photons that have interacted with a piezoelectric effect field.

80. The device of claim 61, wherein the signal generated by detecting the emitted photons that have interacted with the semiconductor/dielectric heterointerface comprises an external field signal generated by detecting the emitted photons that have interacted with one of an external electric field and an external magnetic field.

81. A method of controlling a semiconductor manufacturing process, the method comprising:

determining first and second band-offsets at a semiconductor/dielectric heterointerface, wherein determining the first and second band-offsets comprises:

exposing the semiconductor/dielectric heterointerface to incident photons;

generating a signal by detecting emitted photons that have interacted with the semiconductor/dielectric heterointerface;

changing the energy of the incident photons and monitoring the signal to determine a first threshold energy for injection of first carriers into the dielectric of the semiconductor/dielectric heterointerface, the first threshold energy corresponding to the first band-offset; and changing the energy of the incident photons beyond the first threshold energy and monitoring the signal to determine a second threshold energy for injection of second carriers into the dielectric of the semiconductor/dielectric heterointerface, the second threshold energy corresponding to the second band-offset; and using the determination of the first and second band-offsets at the semiconductor/dielectric heterointerface to control the semiconductor manufacturing process.

* * * * *